US006767475B2

(12) United States Patent
Mearini et al.

(10) Patent No.: US 6,767,475 B2
(45) Date of Patent: Jul. 27, 2004

(54) CHEMICAL-ORGANIC PLANARIZATION PROCESS FOR ATOMICALLY SMOOTH INTERFACES

(75) Inventors: Gerald T. Mearini, Shaker Heights, OH (US); Laszlo Takacs, Shaker Heights, OH (US)

(73) Assignee: Atomic Telecom, Cleveland, OH (US)

( * ) Notice: Subject to any disclaimer, the term of this patent is extended or adjusted under 35 U.S.C. 154(b) by 0 days.

(21) Appl. No.: 09/864,583

(22) Filed: May 24, 2001

(65) Prior Publication Data

US 2001/0051435 A1 Dec. 13, 2001

Related U.S. Application Data

(60) Provisional application No. 60/207,101, filed on May 25, 2000, provisional application No. 60/206,934, filed on May 25, 2000, and provisional application No. 60/207,100, filed on May 25, 2000.

(51) Int. Cl.[7] .............................. B44C 1/22; C23F 1/00; C23F 3/00
(52) U.S. Cl. .......................................... 216/38; 216/81
(58) Field of Search .............................. 216/38, 24, 66, 216/81; 204/192.1, 192.11, 192.12, 192.34, 192.35, 192.36; 438/689, 695, 706, 712; 427/249.7, 249.1, 167; 428/408; 359/582, 586, 577, 588

(56) References Cited

U.S. PATENT DOCUMENTS

| | | | |
|---|---|---|---|
| 4,747,922 A | 5/1988 | Sharp | 204/192.11 |
| 5,529,671 A | 6/1996 | Debley et al. | 204/192.34 |
| 5,725,413 A | 3/1998 | Malshe et al. | 451/41 |
| 5,748,350 A | 5/1998 | Pan et al. | 359/130 |
| 6,205,270 B1 | 3/2001 | Cao | 385/24 |
| 6,233,261 B1 | 5/2001 | Mesh et al. | 372/32 |

OTHER PUBLICATIONS

Kumar, et al.; *Near–Infrared Bandpass Filter from Si/SiO$_2$*; Multilayer Coatings; Feb. 1999.
Suntola, T.; *Cost–Effective Processing by Atomic Layer Epitaxy*;. 1993.
Bachman, et al.; *Molecular Layer Expitaxy by Real–Time Optical Process Monitoring*; Department of Materials Science and Engineering, North Carolina State University, 1997.
H., Kawai, T. Tabata; *Atomic Layer Control of the Growth of Oxide Superconductors Using Laser Molecular Beam Epitaxy*; 1997.
Spiller, E;*Smoothing of Multilayer X–Ray Mirrors by Ion Polishing*; IBM Research Division, Thomas J. Watson; 1993.

(List continued on next page.)

*Primary Examiner*—Shrive P. Beck
*Assistant Examiner*—Roberts P Culbert
(74) *Attorney, Agent, or Firm*—Duane Morris LLP

(57) ABSTRACT

An oxygen ion process, Chemical Reactive-Ion Surface Planarization (CRISP), has been developed which enables planarization of thin film surfaces at the atomic level. Narrow/broad band filters produced with vacuum deposited multilayered thin films are designed to selectively reflect/transmit light at specific wavelengths. The optical performance is limited by the ability to control the individual layer thickness, the "roughness" of the individual layer surfaces and the stoichiometry of the layers. The process described herein will enable reduction of surface roughness at the interfaces of multilayered thin films to produce atomically smooth surfaces. The application of this process will result in the production of notch filters of less than 0.3 nm full width at half maximum (FWHM) centered at the desired wavelength. This will enable optical filters designed for telecommunication components such as next generation dense wavelength division multiplexer (DWDM) systems with significant performance improvement beyond the state-of-the-art.

14 Claims, 3 Drawing Sheets

OTHER PUBLICATIONS

Puik, E.J, van der Wiel and Zeijlemaker, H, and Verhoeven, J.; *Ion Etching of Thin W Layers: Enhancing Reflectivity of W–C Multilayer Coatings*; Mar. 30, 1989.

Nishizawa, J., Abe, H., and Kurabayshi, T.J. 132(5) (1985).

Puik, E.J., et al.; *Appln. Surf. Sci.* 47 (1991) 251.

Kloidt, A, et al.; *Thin Sol Films*, 228 (1993) 154.

Imai, F., Kunimori, K., and Nozoye, H; *Novel Epitaxial Growth Mechanism of Magnesium Oxide/Titanium Oxide Ceramics Superlattice Thin Films Observed by Reflection High–Energy Electron Diffraction*; Nov. 8, 1993.

Kildemo, et al.; *Real Time Control of the Growth of Silicon Alloy Multilayers by Multiwavelength Ellipsometry*; 1996.

ION POLISHING TO REDUCE SURFACE ROUGHNESS

A) Vacuum deposited thin film

B) Ion polishing at near grazing incidence

C) Surface roughness is reduced by a factor of 2

CHEMICAL REACTIVE ION SURFACE PLANARIZATION (CRISP) PROCESS

A) Vacuum deposited thin film

B) Amorphous diamond-like (or optically similar) carbon "over coating"

C) Chemical etching of carbon by highly focused oxygen ion beam at near grazing incidence D) Planarized surface with significantly reduced surface roughness

CHEMICAL-ORGANIC PLANARIZATION PROCESS FOR ATOMICALLY SMOOTH INTERFACES

This application claims priority to U.S. Provisional Patent Application Serial No. 60/207,101, entitled CHEMICAL-ORGANIC PLANARIZATION PROCESS FOR ATOMICALLY SMOOTH INTERFACES, filed on May 25, 2000, U.S. Provisional Patent Application Serial No. 60/206,934, entitled OPTICAL FILTER CONSTRUCTION BY ATOMIC LAYER CONTROL FOR NEXT GENERATION DENSE WAVELENGTH DIVISION MULTIPLEXER, filed on May 25, 2000, and U.S. Provisional Patent Application Serial No. 60/207,100, entitled ATOMIC LAYER CONTROLLED OPTICAL FILTER DESIGN FOR NEXT GENERATION DENSE WAVELENGTH DIVISION MULTIPLEXER, filed on May 25, 2000. The present invention relates to an oxygen ion process called Chemical Reactive-Ion Surface Planarization (CRISP) which reduces the surface roughness of thin film surfaces at the atomic level.

I. BACKGROUND OF THE INVENTION

A. Field of the Invention
B. Description of the Related Art

There are many commercial applications for thin films and, in particular, multilayer films. One particularly promising application is the use of these films in fiber-optic networks. Multilayered films are used in Dense Wavelength Division Multiplexers/Demultiplexers (DWDM) systems which enable information to be delivered inside the fiber optic cables at multiple wavelengths.

The ability to transmit data via fiber optic cables has become of increasing importance in this technological age. At the present time, the installation of a worldwide fiber-optic network is in progress that will be capable of handling levels of data transmission inconceivable only several years ago. As a result of this network, the Internet is less than half a decade away from being a more useful tool than the computers which navigate it. As the biggest technological revolution in the history of modem civilization progresses, advanced high performance coatings have emerged as the enabling technology. The ability to control transmission and reflection of selected wavelengths of light has enabled existing fiber to accommodate the increase in bandwidth which will be required over the next 3–5 years.

Dense Wavelength Division Multiplexers,/Demultiplexer (DWDM) systems enable information to be delivered inside fiber-optic cables at multiples wavelengths. The increase in the bandwidth is limited only by the number of wavelengths which can be superimposed on the fiber. Current state-of-the-art DWDMs can multiplex/demultiplex approximately 130+channels. Ultimately more than 1000 channels will be possible. During transmission, information is packaged within phase modulated carriers at specific wavelengths and superimposed (multiplexing) on the fiber. During reception, the carriers must be separated (demultiplexing). Optical component technology such as DWDMs are critical to achieve bandwidth necessary for future interactive services such as "video on demand", and have prompted multi-billion dollar strategic acquisitions such as OCLI, NetOptix, and XROS.

The most widely used technology for multiplexing and demultiplexing in DWDM systems is thin film-based. Multilayered thin dielectric coatings are comprised of 150–200 layers with individual optical layer thickness equal to multiples of ¼ of the wavelength to be transmitted (known as dielectric interference filters). A collection of such filters coupled together, each differing slightly in design to allow light transmission of different wavelengths, and "connected" to a fiber-optic cable enables the multiplexing (superposition) and demultiplexing (separation) of multiple wavelengths of laser light containing digital information.

Current thin film multiplexers and demultiplexers can handle up to 40 different wavelengths but several manufacturers have announced 80 channel versions in year 2000. With current state-of-the-art deposition processes used for DWDM, 80 channel multiplexers will approach the limit of the technology. Theoretical thin film filter designs exist with Full Width at Half Maximum (FWHM) of less than 0.1 nm. Such a filter would enable multiplexers capable of handling more than 1000 channels.

Surface roughness reduction and interface smoothing by ion bombardment has been examined extensively for multilayered films designed for x-ray reflectors. In that collection of work it was observed that, by "ion polishing" the film surfaces using $Ar^+$ or $O^+$ ions accelerated from an ion source, surface roughness ($R_a$ was reduced by a factor of 2 as is shown in FIG. 1. It was also observed that deposition of a thin amorphous carbon (C) layer at each interface, between layers of multi layered reflectors, was successful at reducing interface roughness.

It is well known that a very hard low surface roughness amorphous carbon coating be deposited with various ion processes including ion beam deposition (IBD) and plasma enhanced chemical vapor deposition (PECVD). These coatings are used primarily for anti-abrasion and as antireflective surfaces on germanium substrates for infrared transmissive windows.

Diamond-like carbon (DLC), and other forms of amorphous carbon, can be stripped from substrates by exposing the surface to an energetic (>50 V) oxygen plasma. The energetic oxygen ions react chemically with the carbon surface to form carbon monoxide (CO). The vapor pressure of CO is high enough, at the vacuum level at which this process is performed ($\sim 10^{-2}$ torr), that the CO molecules "evaporate" from the surface. The freshly exposed surface carbon then reacts with the plasma and the process continues until the oxygen plasma is extinguished or no amorphous carbon remains.

The present invention contemplates a new and improved process for reducing the surface roughness of thin films which is simple in design, effective in use, and overcomes the foregoing difficulties and others while providing better and more advantageous overall results.

II. SUMMARY OF THE INVENTION

In accordance with the present invention, a new and improved process is provided which reduces the surface roughness of thin films at the atomic level.

In accordance with another aspect of the present invention, a surface planarization process for planarizing vacuum-grown thin films includes the steps of depositing a thin layer of silicon dioxide onto a near-atomically flat fused silica substrate, depositing approximately a one-nanometer thick first layer of amorphous carbon onto the silicon dioxide, directing a well-focused oxygen ion beam onto the carbon coated silicon dioxide at near grazing incidence, rastering the ion beam in a sweeping fashion to allow interaction with only the carbon which protrudes above average surface height, the rastering being continued until a top layer of carbon is reduced to the level of the highest peaks in the thin film, depositing a thin layer of a titanium dioxide onto the carbon coated silicon dioxide, depositing approximately a one-nanometer thick second layer of amorphous carbon onto the titanium dioxide, directing a well-focused oxygen ion beam onto the carbon coated titanium dioxide at near-grazing incidence, rastering the ion beam in a sweeping fashion to allow interaction with only the carbon which protrudes above average surface height, the rastering being continued until a top layer of carbon is reduced to the level of the highest peaks of the thin film, and repeating the process as necessary.

In accordance with still another aspect of the present invention a process for planarizing thin film surfaces includes the steps of depositing a material onto a near-atomically flat substrate, depositing carbon onto the material, directing an ion beam onto the carbon coated material, rastering the ion beam until the carbon is reduced to approximately the level of the highest peaks of the material, depositing a second material onto the carbon coated material, depositing carbon onto the second material, directing an ion beam onto the carbon coated second material, rastering the ion beam until the carbon is reduced to approximately the level of the highest peaks of the second material, and the process is repeated as necessary.

In accordance with yet another aspect of the present invention, the process includes depositing a low index material onto a near-atomically flat fused silica substrate, depositing a high index material onto a carbon coated low index material, depositing approximately a one-nanometer thick first layer of amorphous carbon onto the low index material, and depositing approximately a one-nanometer thick second layer of amorphous carbon onto the high index material.

In accordance with another aspect of the present invention, the process includes depositing a thin layer of silicon dioxide onto a near-atomically flat fused silica substrate, depositing a thin layer of a material, chosen from the group comprising: titanium dioxide and tantalum pentoxide, onto a near-atomically flat fused silica substrate, rastering the ion beam in a sweeping fashion to allow interaction with only the carbon which protrudes above average surface height, the rastering being continued until a top layer of carbon is reduced to the level of the highest peaks in the thin film, directing a well-focused oxygen ion beam onto the carbon coated silicon dioxide at near grazing incidence, and directing a well-focused oxygen ion beam onto the carbon coated titanium dioxide at near grazing incidence.

In accordance with another aspect of the present invention, the process includes depositing a thin layer of silicon dioxide onto a near-atomically flat fused silica substrate, the silicon dioxide being deposited via a process chosen from the group comprising: ion beam deposition, ion beam sputter deposition, molecular beam epitaxy, and atomic layer epitaxy.

In accordance with another aspect of the present invention, a thin film filter design includes a near-atomically flat substrate, at least one low index layer, at least one high index layer, and at least one carbon layer on each of the at least one index layers, the at least one carbon layer being reduced by an ion beam.

In accordance with still another aspect of the present invention, the film is a dielectric film with a thickness of approximately 150 nanometers, the dielectric film has a surface roughness of approximately 0.05 nanometers, the substrate is fused silica, the at least one low index layer is silicon dioxide and the at least one high index layer is titanium dioxide, the ion beam is a well focused oxygen ion beam, and the at least one low index layer and the at least one high index layer are layered alternately.

To accomplish these objectives, an oxygen ion process, Chemical Reactive-Ion Surface Planarization (CRISP), has been developed which enables planarization of thin film surfaces at the atomic level. Narrow/broad band filters produced with vacuum deposited multilayered thin films are designed to selectively reflect/transmit light at specific wavelengths. The optical performance is limited by the ability to control the individual layer thickness, the "roughness" of the individual layer surfaces and the stoichiometry of the layers. The process described here will enable reduction of surface roughness at the interfaces of multilayered thin films to produce atomically smooth surfaces. The application of this process will result in the production of notch filters of less than 0.3 nm full width at half maximum (FWHM) centered at the desired wavelength. This will enable optical filters designed for telecommunication components such as next generation dense wavelength division multiplexer (DWDM) systems with significant performance improvement beyond the state-of-the-art.

Still other benefits and advantages of the invention will become apparent to those skilled in the art upon a reading and understanding of the following detailed specification.

III. BRIEF DESCRIPTION OF THE DRAWINGS

The invention may take physical form in certain parts and arrangement of parts. At least one embodiment of these parts will be described in detail in the specification and illustrated in the accompanying drawings, which form a part of this disclosure and wherein.

IV. DESCRIPTION OF THE INVENTION

Figure 1:
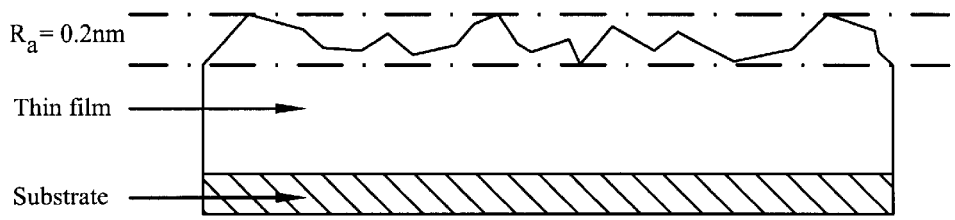
FIG. 1A is an illustration of a vacuum deposited thin film.
FIG. 1B is an illustration of ion polishing at near grazing incidence.
FIG. 1C shows the resultant surface roughness after the ion polishing in FIG. 1b.
Figure 1:
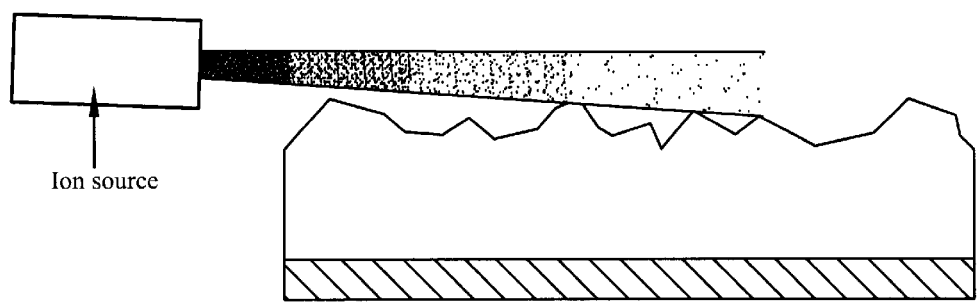
Figure 1:
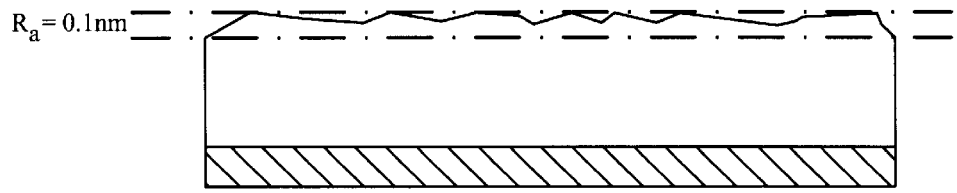
Figure 2:
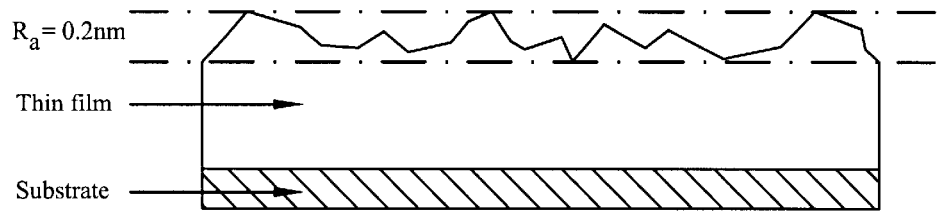
FIG. 2A is an illustration of a vacuum deposited thin film.
FIG. 2B is an illustration of amorphous diamond-like (or optically similar) carbon "overcoating;"
FIG. 2C is an illustration of chemical etching of carbon by an ion beam.
FIG. 2D shows the resultant surface roughness after the planarization process of FIGS. 2A–2C; and, FIG. 3 shows a $SiO_2/TiO_2$ multilayer filter, created by the inventive process.
Figure 2:
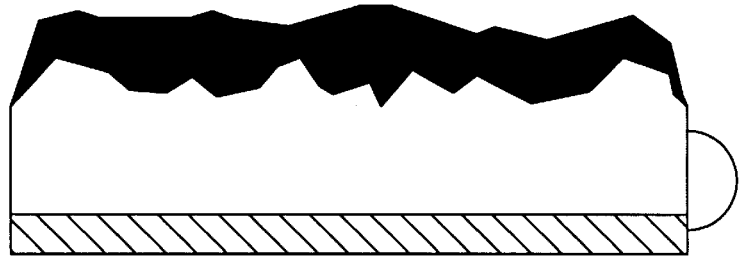
Figure 2:
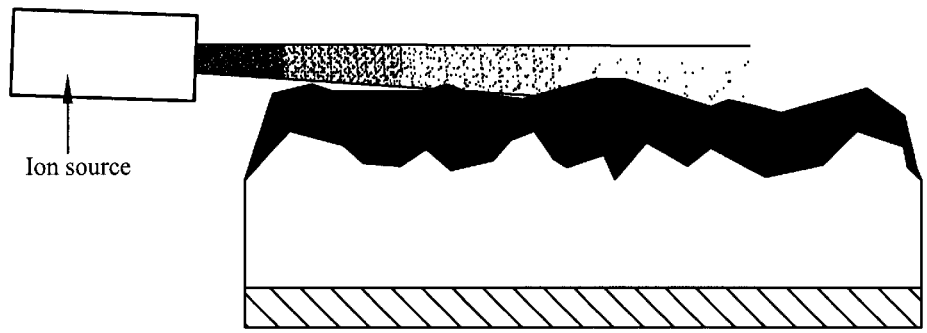
Figure 2:
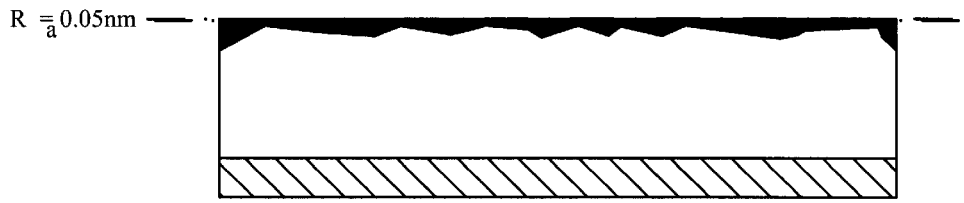
Figure 3:
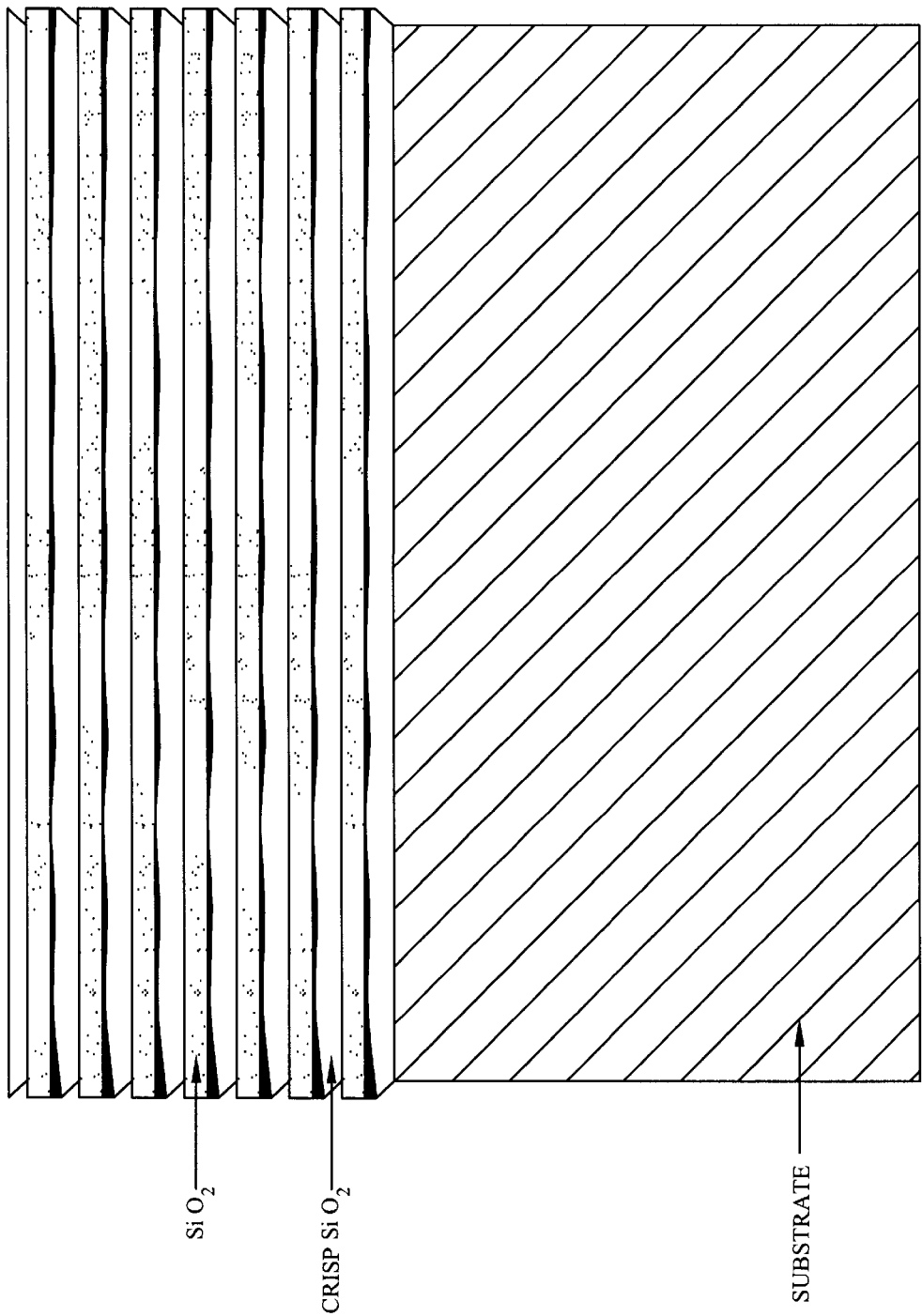

Referring now to the drawings, which are for purposes of illustrating at least one embodiment of the invention only, and not for purposes of limiting the invention, FIG. 2 and FIG. 3 show the steps of the inventive process. In this embodiment, the planarization process uses the surface roughness reduction effect of oxygen ions along with the reactive nature of amorphous carbon in an oxygen ion environment to planarize vacuum grown thin films.

In order to produce atomically smooth (by "atomically smooth" it is meant a surface roughness of approximately <0.05 nanometers) surfaces, the thin film must be deposited with a process that, initially, produces films with very low surface roughness (~0.1–0.2 nanometers). Processes capable of this include, but are not limited to, ion beam assisted deposition (IBAD), ion beam sputter deposition (IBSD), and epitaxial growth processes such as, but not limited to, molecular beam epitaxy (MBE) and atomic layer epitaxy (ALE). It is to be understood that the foregoing list of deposition processes is not intended to limit the invention in any manner, and any deposition process, as long as chosen using sound engineering judgment, will allow effective reduction of the surface roughness.

The inventive process, in this embodiment, is intended to create atomically smooth surfaces at interfaces between optical quarter-wave thick layers of multi-layered thin film coatings designed for high performance filters and thin-filmed based multiplexers and demultiplexers for DWDM systems. The process can be used to reduce surface roughness in any thin-filmed based technology utilizing materials onto which amorphous carbon will adhere. In one embodiment of the invention, a thin layer of a low index material, such as silicon dioxide ($SiO_2$), or a high index material such as titanium dioxide ($TiO_2$) or tantalum pentoxide ($Ta_2O_5$), is deposited onto a near atomically flat fused silica substrate, as shown in FIG. 2A, using one of the deposition processes previously mentioned.

At the end of the deposition, the thin film that remains is a high quality dielectric film, which has an approximate thickness of 150 nanometers, and a surface roughness of approximately 0.2 nanometers.

With reference to FIG. 2B, a very thin layer of amorphous carbon, which is optically transparent in the infrared (i.e. diamond-like carbon), approximately 1–10 nanometers in thickness, is deposited onto the thin film by PECVD, IBD, or a similar process. Any process can be used for depositing the amorphous carbon, as long as using sound engineering judgment.

With reference to FIG. 2C, after the carbon layer is deposited, a well-focused oxygen ion beam is directed onto the carbon-coated surface at near grazing incidence. The ion beam energy is set high enough to minimize the spread of the beam. The ion beam is rastered in a sweeping fashion to allow interaction with only the carbon that protrudes above the average surface height. This process is maintained until the top layer of carbon is reduced to the level of the highest peaks in the surface of thin film. Ultimately, this has the effect filling in the valleys and leveling the initially rough surface.

For a typical thin filter design, the filter construction would continue with depositions of layers, alternating low and high index of refraction. A representative filter of the inventive process, as described in this embodiment, is shown in FIG. 3. FIG. 3 depicts epitaxially grown $TiO_2$ with atomic layer control, and alternating layers of amorphous silicon dioxide, made atomically smooth by the inventive process. Each surface can be planarized as necessary. The optical properties of the amorphous carbon layer must be incorporated into the final design of the filter. If individual layer surface roughness does not require further planarization, the process is used only when necessary.

The inventive process, when applied to thin-film filter designs, will result in a minimum achievable surface roughness at interfaces. When this process in used in conjunction with thin-filmed deposition processes, which possess angstrom level control of thickness and surface roughness, high performance filters can be produced to enable a next generation DWDM components.

The invention has been described with reference to at least one embodiment. Obviously, modifications and alterations will occur to others upon a reading and understanding of the specification. It is intended by applicant to include all such modifications and alterations insofar as they come within the scope of the appended claims or the equivalents thereof.

Having thus described the invention, it is now claimed:

1. A surface planarization process for planarizing vacuum-grown thin films, the process comprising the steps of:

depositing a thin layer of silicon dioxide onto a near-atomically flat fused silica substrate;

depositing approximately a 1–10 nanometer thick first layer of amorphous diamond-like carbon onto the silicon dioxide;

directing a well-focused oxygen ion beam onto the carbon coated silicon dioxide at near grazing incidence;

rastering the ion beam in a sweeping fashion to allow interaction with only the carbon which protrudes above average surface height, the rastering being continued until a top layer of carbon is reduced to the level of the highest peaks in the thin film;

depositing a thin layer of a titanium dioxide onto the carbon coated silicon dioxide;

depositing approximately a one-nanometer thick second layer of amorphous carbon onto the titanium dioxide;

directing a well-focused oxygen ion beam onto the carbon coated titanium dioxide at near-grazing incidence;

rastering the ion beam in a sweeping fashion to allow interaction with only the carbon which protrudes above average surface height, the rastering being continued until a top layer of carbon is reduced to the level of the highest peaks of the thin film; and, repeating the process at least once.

2. A process for planarizing thin film surfaces, the process comprising the steps of:

depositing a material onto a near-atomically flat substrate;

depositing carbon onto the material, the carbon being transparent in the infrared;

directing an ion beam onto the carbon coated material; and, rastering the ion beam until the carbon is reduced to approximately the level of the highest peaks of the material.

3. The process of claim 2, wherein the method further comprises the steps of:

depositing a second material onto the carbon coated material;

depositing carbon onto the second material;

directing an ion beam onto the carbon coated second material; and, rastering the ion beam until the carbon is reduced to approximately the level of the highest peaks of the second material.

4. The process of claim 3 wherein the process is repeated at least once.

5. The process of claim 2, wherein depositing a material onto a near-atomically flat substrate comprises the step of:

depositing a low index material onto a near-atomically flat fused silica substrate.

6. The process of claim 3, wherein the depositing a second material onto the carbon coated material comprises the step of:

depositing a high index material onto a carbon coated low index material.

7. The process of claim 5, wherein depositing carbon onto the material comprises the step of:

depositing approximately a 1–10 nanometer thick first layer of amorphous carbon onto the low index material.

8. The process of claim 6, wherein depositing carbon onto the second material comprises the step of:

depositing approximately a 1–10 nanometer thick second layer of amorphous carbon onto the high index material.

9. The process of claim 7, wherein depositing a low index material onto a near-atomically flat fused silica substrate comprises the step of:

depositing a thin layer of silicon dioxide onto a near-atomically flat fused silica substrate.

10. The process of claim 8, wherein depositing a high index material onto a near-atomically flat fused silica substrate comprises the step of:

depositing a thin layer of a material, chosen from the group comprising:
titanium dioxide and tantalum pentoxide, onto a near-atomically flat fused silica substrate.

11. The process of claim 9, wherein rastering the ion beam until the carbon is reduced to approximately the level of the highest peaks of the material comprises the step of:

rastering the ion beam in a sweeping fashion to allow interaction with only the carbon which protrudes above average surface height, the rastering being continued until a top layer of carbon is reduced to the level of the highest peaks in the thin film.

12. The process of claim 11, wherein directing an ion beam onto the carbon coated material comprises the step of:

directing a well-focused oxygen ion beam onto the carbon coated silicon dioxide at near grazing incidence.

13. The process of claim 10, wherein directing an ion beam onto the carbon coated second material comprises the step of.

directing a well-focused oxygen ion beam onto the carbon coated titanium dioxide at near grazing incidence.

14. The process of claim 12, wherein depositing a thin layer of silicon dioxide onto a near-atomically flat fused silica substrate, further comprises the step of:

depositing a thin layer of silicon dioxide onto a near-atomically flat fused silica substrate, the silicon dioxide being deposited via a process chosen from the group comprising:
ion beam deposition, ion beam sputter deposition, molecular beam epitaxy, and atomic layer epitaxy.

* * * * *